United States Patent
Fifield et al.

(10) Patent No.: US 6,281,731 B1
(45) Date of Patent: Aug. 28, 2001

(54) CONTROL OF HYSTERESIS CHARACTERISTIC WITHIN A CMOS DIFFERENTIAL RECEIVER

(75) Inventors: John A. Fifield, Underhill; Russell J. Houghton, Essex Junction; Wilbur D. Pricer, Charlotte; William R. Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/428,639

(22) Filed: Oct. 27, 1999

(51) Int. Cl.$^7$ .................................................. H03K 3/297
(52) U.S. Cl. .................................................. 327/205
(58) Field of Search .................................. 327/205, 206, 327/427, 379, 389, 391, 434, 537, 541, 593, 563

(56) References Cited

U.S. PATENT DOCUMENTS

| | | | |
|---|---|---|---|
| 4,535,294 | 8/1985 | Ericksen et al. | 328/150 |
| 4,775,807 | 10/1988 | Bukowski, Jr. | 307/359 |
| 4,897,569 | * 1/1990 | Calzi | 327/206 |
| 5,099,146 | 3/1992 | Miki et al. | 307/350 |
| 5,397,934 | 3/1995 | Merrill et al. | 327/537 |
| 5,463,339 | * 10/1995 | Riggio, Jr. | 327/206 |
| 5,512,852 | 4/1996 | Kowalski | 327/206 |
| 5,608,344 | 3/1997 | Marlow | 327/206 |
| 5,656,957 | * 8/1997 | Marlow et al. | 327/67 |
| 5,694,072 | 12/1997 | Hsiao et al. | 327/537 |
| 5,796,281 | 8/1998 | Saeki et al. | 327/206 |
| 6,118,318 | * 9/2000 | Fifield et al. | 327/206 |

OTHER PUBLICATIONS

J. F. Ewen and D. Rogers, IBM Technical Disclosure Bulletin, "MESFET Differential Current Switch Comparator Circuit", vol. 31, No. 3, Aug. 1988, pp. 192–193.

* cited by examiner

Primary Examiner—My-Trang Nu Ton
(74) Attorney, Agent, or Firm—Heslin Rothenberg Farley & Mesiti P.C.; Kevin P. Radigan, Esq.; Robert A. Walsh, Esq.

(57) ABSTRACT

A differential receiver has a switching point accurately set according to a reference voltage, which switching point is dynamically modified, that is, dc hysteresis is provided, by a circuit internal to the differential receiver. Positioning of the resultant hysteresis characteristic about the reference signal is adjusted by establishing a backgate voltage differential between an input transistor and a reference transistor of the differential receiver. A switching circuit is also provided for controlling switching of a hysteresis circuit at the reference signal plus or minus a desired offset. The switching circuit is gated by an output signal of the input transistor.

23 Claims, 8 Drawing Sheets fig. 1A fig. 1B fig. 2 fig. 2A fig. 2B fig. 2C fig. 2D fig. 2E fig. 3A fig. 3B

CONTROL OF HYSTERESIS CHARACTERISTIC WITHIN A CMOS DIFFERENTIAL RECEIVER

TECHNICAL FIELD

The present invention relates generally to input buffer circuits, and more particularly, to a differential receiver with a hysteresis characteristic adjusted and/or controlled, e.g., to be centered about a reference voltage.

BACKGROUND OF THE INVENTION

Several different integrated circuit technologies are available to circuit and system designers in which to realize their designs. These technologies include for example, bipolar, complementary metal oxide semiconductor (CMOS), bipolar-CMOS (Bi-CMOS), gallium arsenide (GaAs), and others. As would be expected, integrated circuits based on different technologies, or based on differing logic families within a technology, are often required to operate within a single system, and hence, must accurately communicate one with another.

One common problem that must be dealt with is the differing logic level voltages associated with the differing technologies, or between differing circuit families within a single technology. This problem is sometimes further exacerbated by supply voltage levels which may vary significantly, not only between different technologies, but even amongst circuits of like technologies. Additionally, it is now common to have a higher voltage to operate input/output circuits and a second lower voltage to operate internal circuits. In order to deal with such differences between circuits and technologies, designers rely upon input buffer circuits (also known as "voltage translators", or "differential receivers") that are capable of translating input signal levels from an external circuit into needed logic levels of internal circuits.

An input buffer circuit with a hysteresis characteristic has been used in order to prevent a situation where the input buffer circuit turns on or off by not only the input signal but also by noise associated with the input signal, thereby inhibiting the proper propagation of the input signal. The input buffer circuit with a hysteresis characteristic has two threshold values, namely $V_{Th}$ and $V_{Tl}$. $V_{Th}$ is the threshold value for the case where the input signal rises, and $V_{Tl}$ is the threshold value for the case where the input signal falls. Accordingly, if the input signal becomes larger than $V_{Th}$ and the input buffer turns on, the circuit will not go low until the input voltage becomes smaller than $V_{Tl}$. In this situation, noise with a width of $V_{Th}-V_{Tl}$ is eliminated.

Ideally, the hysteresis characteristic is centered about a reference voltage of the input buffer circuit. However, power supply variations and component tolerances often result in a distorted hysteresis characteristic, e.g., non-symmetrical about the reference signal. Thus, there exists a need in the art for an input buffer circuit or differential receiver designed with a hysteresis characteristic that is capable of being held more closely centered about the reference signal.

DISCLOSURE OF THE INVENTION

Briefly summarized, in a first aspect the present invention comprises a metal oxide semiconductor (MOS) differential receiver which includes a hysteresis circuit for endowing the MOS differential receiver with a hysteresis characteristic, and means for adjusting the hysteresis characteristic about a reference voltage of the MOS differential receiver. The adjusting means includes means for establishing a dc backgate voltage differential between an input transistor and a reference transistor of the MOS differential receiver, wherein the reference transistor receives the reference voltage.

In another aspect, a metal oxide semiconductor (MOS) differential receiver is provided which includes a first transistor coupled for receiving a first signal and a second transistor coupled for receiving a second signal. A bias circuit is provided having a supply voltage coupled to the first transistor and the second transistor, as well as a current source. A hysteresis circuit is coupled in parallel with the second transistor between the supply voltage and the current source. When in operation, the first signal comprises an input signal, the second signal comprises a reference signal and an output signal is provided from an output of the first transistor. A bias voltage is applied as a dc backgate potential to at least one of the first transistor and the second transistor in order to adjust about the reference signal the hysteresis characteristic produced by the hysteresis circuit. In an enhanced embodiment, the backgate potential is adjusted to establish the hysteresis characteristic substantially symmetrical about the reference signal.

In still another aspect, a metal oxide semiconductor (MOS) differential receiver is provided which includes a first transistor coupled for receiving a first signal, and a second transistor coupled for receiving a second signal. A bias circuit provides a supply voltage to the first transistor and the second transistor, as well as a current source coupled to the first and second transistors. A hysteresis transistor is coupled in parallel with the second transistor, and a switching circuit is provided for gating the hysteresis transistor. The switching circuit is coupled between a reference signal plus a first offset voltage and the reference signal minus a second offset voltage for applying one of the reference signal plus the first offset voltage or the reference signal minus the second offset voltage to the gate of the hysteresis transistor. The switching circuit is controlled by a signal at an output of the first transistor. In operation, the first signal comprises an input signal, the second signal comprises the reference signal, and the signal at the output of the first transistor comprises an output signal of the differential receiver.

In a further aspect, a method is provided for adjusting a predetermined switching point of a differential receiver circuit which receives a logic signal input having first and second states. The differential receiver circuit includes an input transistor and a reference transistor, each coupled to a bias circuit. The method comprises: deriving a reference voltage for application to the reference circuit, the reference voltage having a voltage magnitude substantially equal to a voltage magnitude of the predetermined switching point; receiving the logic input signal at the input circuit; translating the logic input signal in the differential receiver circuit to an output having an output in a first state when the logic input signal is in a first state, and translating the output to a second state when the logic input signal is in a second state; modifying the switching point to a lower voltage level when the output changes to the first state, and modifying the switching point to a higher voltage level when the output changes to the second state, wherein the modifying includes disposing the lower level and the higher level about the predetermined switching point by establishing a backgate voltage differential between the reference transistor and the input transistor.

To restate, provided herein is an input buffer circuit comprising a differential receiver with a hysteresis characteristic that is advantageously controlled, e.g., to be centered about a reference signal. Tuning of the hysteresis characteristic is achieved by varying a backgate potential of at least one of the input transistor and the reference transistor of a MOS differential receiver implementation to thereby establish a dc backgate voltage differential between the input transistor and the reference transistor. A MOS differential receiver implemented in accordance with this invention provides improved sharpness at the switching thresholds and any degree of hysteresis. The switching thresholds are further constrained by a switching circuit connected to gate the hysteresis circuit by selectively applying the reference voltage to the hysteresis circuit plus a first predefined offset voltage, and minus a second predefined offset voltage. The differential receiver continues to operate with decreasing power supplies, and satisfactory operation, with common mode rejection, extends from slightly above ground to power supply voltage VDD. The differential receiver is largely insensitive to environments with unsymmetrically placed power supplies (VDD), reference signals (Vref) and ground voltages, as well as to variations in transistor channel lengths.

BRIEF DESCRIPTION OF THE INVENTION

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1A:
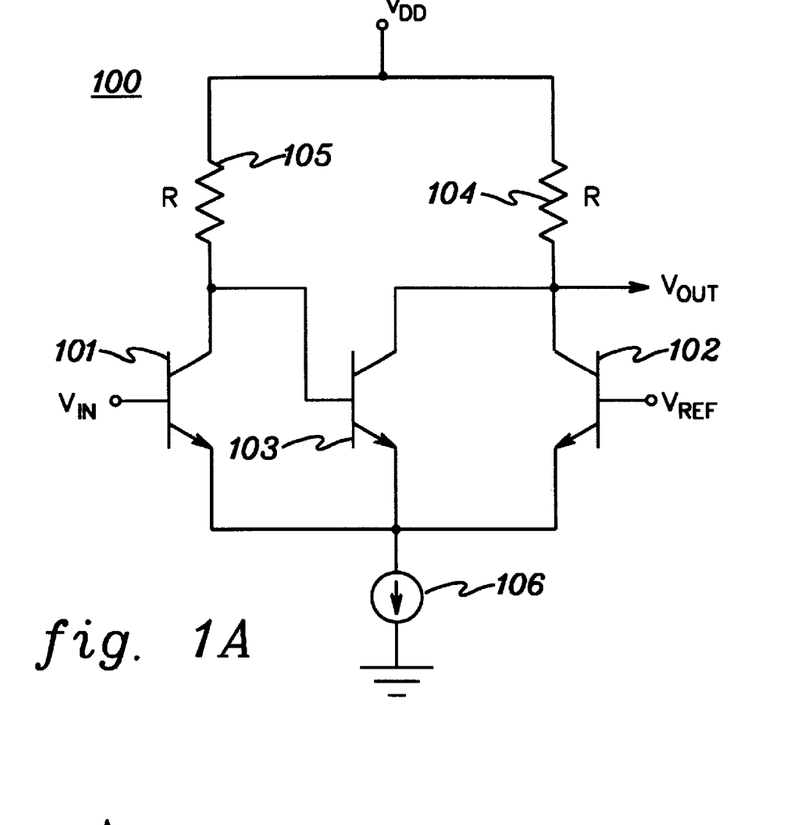
FIG. 1A is a diagram of a bipolar differential receiver with a hysteresis characteristic.

FIG. 1 depicts one embodiment of a bipolar differential receiver, generally denoted 100. Receiver 100 includes an input transistor 101, a reference transistor 102 and a hysteresis transistor 103. In this embodiment, transistors 101, 102 & 103 each comprise npn-type bipolar transistors, with their emitters commonly connected to a current source 106. Transistors 102 & 103 are connected in parallel between an output node (Vout) and the current source 106. A power supply (VDD) couples to the transistors across resistor 104 and resistor 105 as shown. The collector of input transistor 101 gates the hysteresis transistor 103, while input transistor 101 is gated by the input voltage signal (Vin) and a reference voltage signal (Vref) gates the reference transistor 102.

As is well-known, reference voltage Vref comprises the switching reference voltage for switching the output of differential receiver 100 from a first logic level to a second logic level. By way of example, Vref might comprise one volt, with a logic low state Vin of 0.7 volts and a logic high state for the input signal (Vin) of 1.3 volts.

Figure 1B:
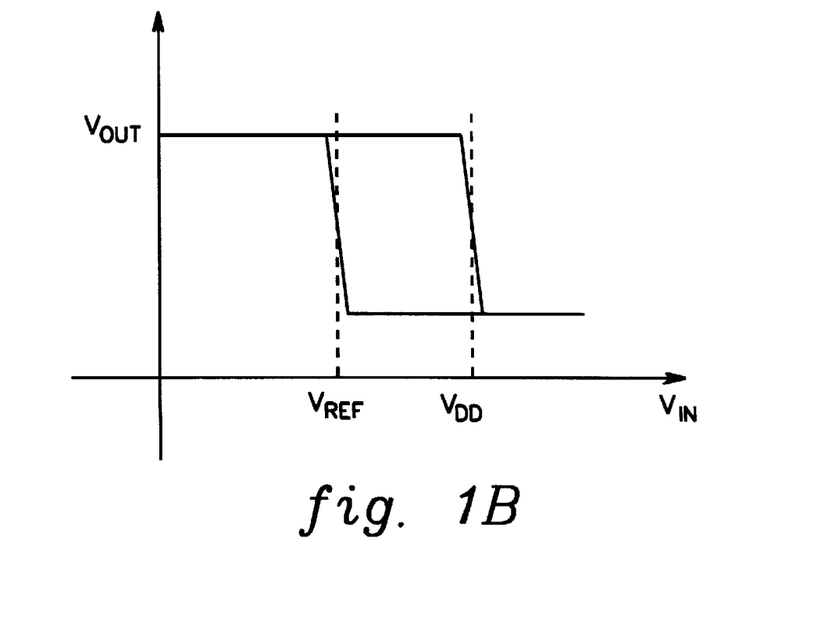
FIG. 1B is a typical static response curve of the hysteresis characteristic for the bipolar differential receiver of FIG. 1A.

The hysteresis effect of the center transistor 103 connected as shown is depicted in FIG. 1B. In this figure, the hysteresis characteristic is shown offset to the right of the reference voltage Vref. Ideally, however, the hysteresis characteristic is closely centered or even symmetrical about the reference signal (Vref). Unfortunately, the physics of the bipolar device of FIG. 1A prevent easy shifting of the hsyteresis characteristic to a position about the reference signal Vref.

Figure 2:
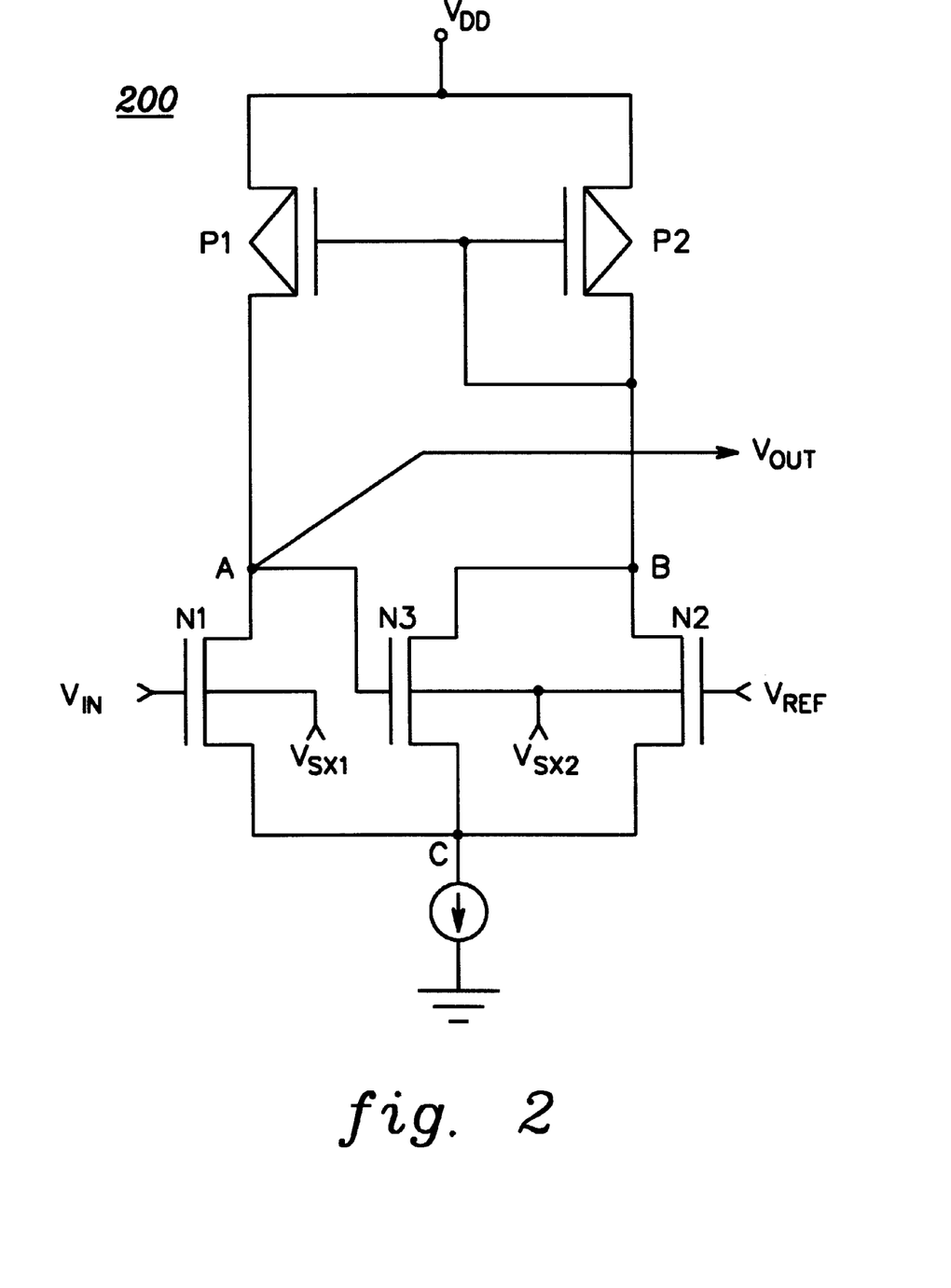
FIG. 2 depicts one embodiment of a complementary metal oxide semiconductor differential receiver in accordance with the principles of the present invention.

One embodiment of a complementary metal oxide semiconductor (CMOS) differential receiver, generally denoted 200, is shown in FIG. 2. Differential receiver 200 includes an input transistor N1, a reference transistor N2 and a hysteresis transistor N3. Transistors N1, N2 and N3 each comprise NMOS transistors in this embodiment. Input transistor N1 is gated by the input signal Vin, reference transistor N2 is gated by the reference signal Vref, and hysteresis transistor N3 is gated by the signal at node A output from transistor N1. An output of hysteresis transistor N3 is connected to the output of the reference transistor N2 at node B.

The differential receiver is powered by a supply voltage (VDD), e.g., connected to transistors N1, N2 & N3 across a current mirror comprising PMOS transistors P1 & P2 as shown. Transistor P2 is connected in diode configuration for enhanced switching. The output reference signal Vout is taken at node A. As noted, the voltage reference transistor N2 is biased by Vref, which is a stable dc voltage about which Vin ideally swings above for a logic level "1" and below for a logic level "0". Thus, Vref has a voltage magnitude substantially equal to the desired switching point of the input transistor N1 and hence the desired switching point of the differential receiver or amplifier 200. Vref can be generated internally on chip, or derived from an external signal source so that internal switching levels will track external voltage conditions (e.g., a voltage divider of an external supply voltage). Without the addition of the hysteresis feedback (N3), a change in the input logic level, even slightly above or below Vref (as may be caused by noise or glitches), will cause the voltage at the output to switch (fault switching) to the corresponding state of the input logic level.

Adding the hysteresis feedback (N3) alters the operation of the differential amplifier 200 by effectively filtering noise and glitches independent of time. As explained above, the resultant hysteresis characteristic is conventionally offset from the desired switching voltage (Vref). This offset is a function of VDD and the transconductance of N3, and is sensitive to power supply variations and component tolerances.

In accordance with the principles of the present invention, the backgate potentials of input transistor N1, reference transistor N2 and hysteresis transistor N3 are controlled in order to establish a differential therebetween and thereby move the hysteresis characteristic, for example, to a position more closely centered about the reference signal Vref. By way of example, the backgate voltage potential Vsx1 of input transistor N1 might comprise 0.2 volts, while the backgate potential Vsx2 of reference transistor N2 might comprise 0 volts. Again, these values are provided by way of example only, and optimum values can be determined experimentally by one skilled in the art for a given differential receiver. For example, Vsx1 might comprise 0.5 volts, while Vsx2 might comprise 0.3 volts. In this embodiment, the backgates of the hysteresis transistor N3 and the reference transistor N2 are shown to comprise a common potential. As will be understood by one skilled in the art, the "backgate potential" refers to the potential of the well within which the transistor resides. Conventionally, this backgate potential is common among all transistors and comprises a substrate potential which is typically at ground. This concept of adjusting the backgate potential applies as well to PMOS implementations of the differential transistor pair of the receiver.

In operation, with a rising input signal Vin above the Vref, current begins to flow through input transistor N1, as the current through transistor N1 increases, while current decreases through reference transistor N2 and hysteresis transistor N3. The output of input transistor N1 at node A tends lower in voltage which shuts off hysteresis transistor N3, having a regenerative effect sharply switching the differential receiver. The current switches entirely to the input transistor N1 and the output is pulled low.

Conversely, with a falling input voltage Vin, current will begin to shift from input transistor N1 to reference transistor N2 as the input voltage reaches Vref. If the backgate potentials Vsx1 and Vsx2 are equal, then with a falling reference voltage the switch occurs at Vref. In accordance with the principles of the present invention, however, by offsetting the backgate potentials Vsx1 and Vsx2, it is possible to change the threshold of input transistor N1 and reference transistor N2 to re-center the hysteresis about the reference signal.

Figure 2A:
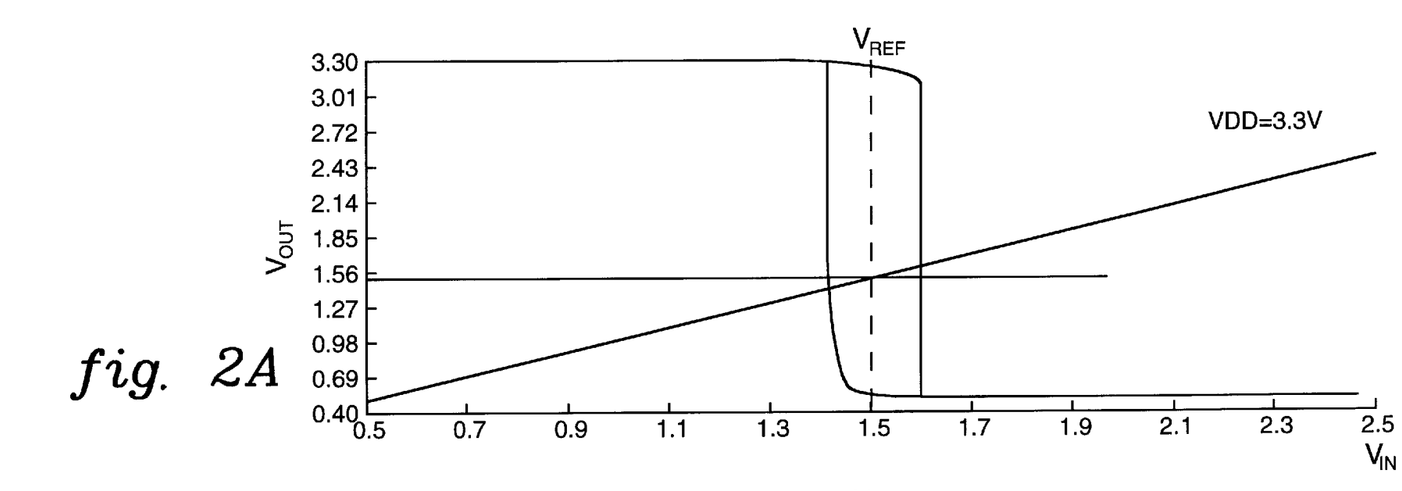
FIGS. 2A & 2B depict static response curve simulations showing the hysteresis characteristic of the differential receiver of FIG. 2 with power supply voltage at 3.3 volts and 3.8 volts, respectively.
Figure 2B:
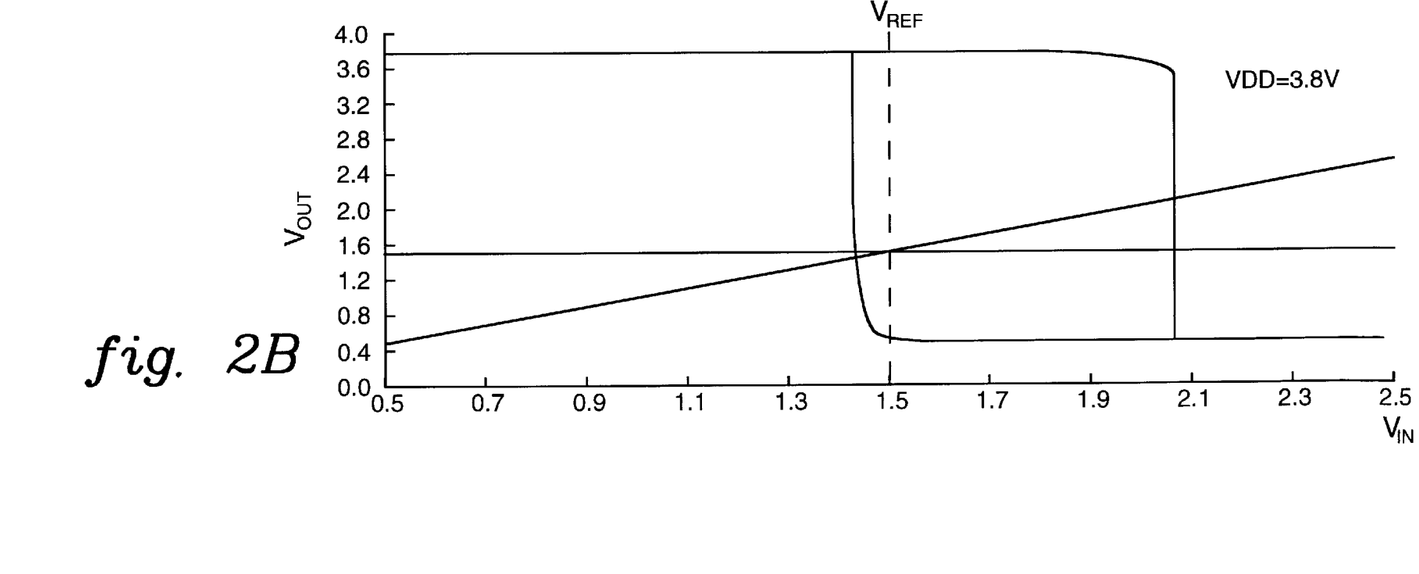
Figure 2C:
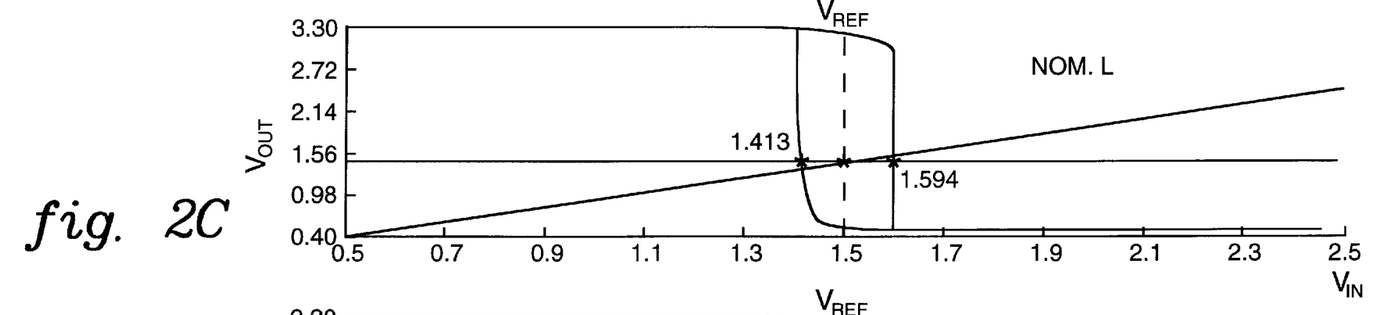
FIGS. 2C, 2D & 2E depict static response curve simulations of the hysteresis characteristic for the differential receiver of FIG. 2 wherein transistor channel length is varied from a nominal length, to nominal length plus 70 nm, to nominal length minus 70 nm, respectively.
Figure 2D:
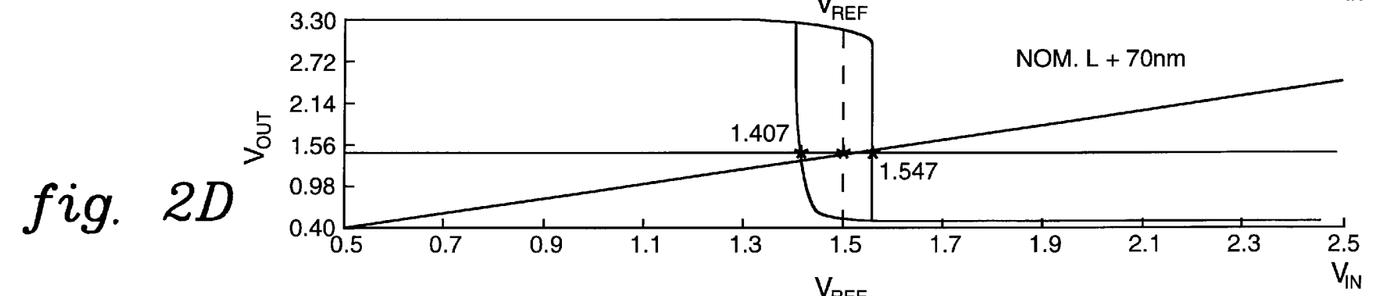
Figure 2E:
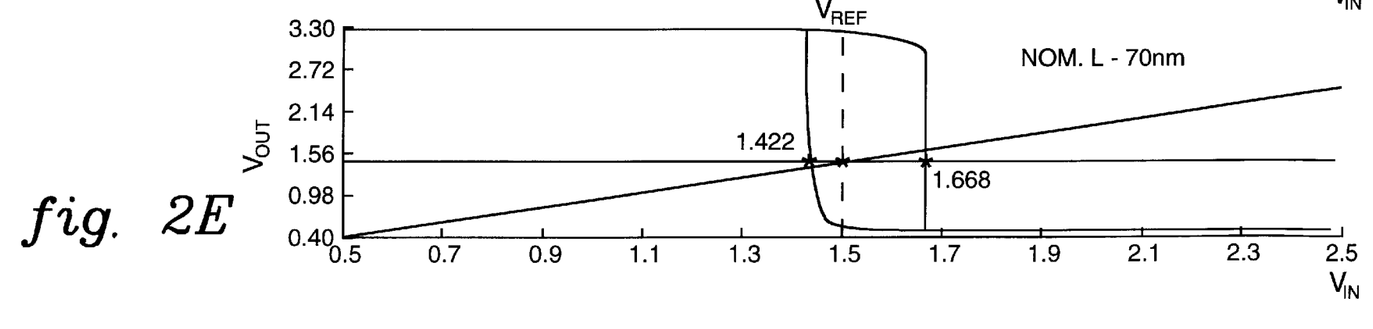

Sensitivity of the hysteresis characteristic to voltage supply variations is depicted in the simulations of FIGS. 2A & 2B for the circuit of FIG. 2. As shown, the hysteresis characteristic varies significantly with increase in power supply voltage from 3.3 volts (FIG. 2A) to 3.8 volts (FIG. 2B). FIGS. 2C–2E depict further simulations using the circuit of FIG. 2 wherein power supply voltage is assumed constant, while transistor channel length is varied ±70 nm about a nominal length (Nom L). Again as shown, the hysteresis characteristic varies from the desired centered configuration of FIG. 2C with increase or decrease in the channel length. Thus, in accordance with the invention, it is possible to create a backgate voltage differential between input transistor N1 and reference transistor N2 in order for a particular differential receiver with hysteresis to be tuned such that the hysteresis characteristic is brought to a more centered or symmetrical disposition about the reference signal (Vref).

Figure 3A:
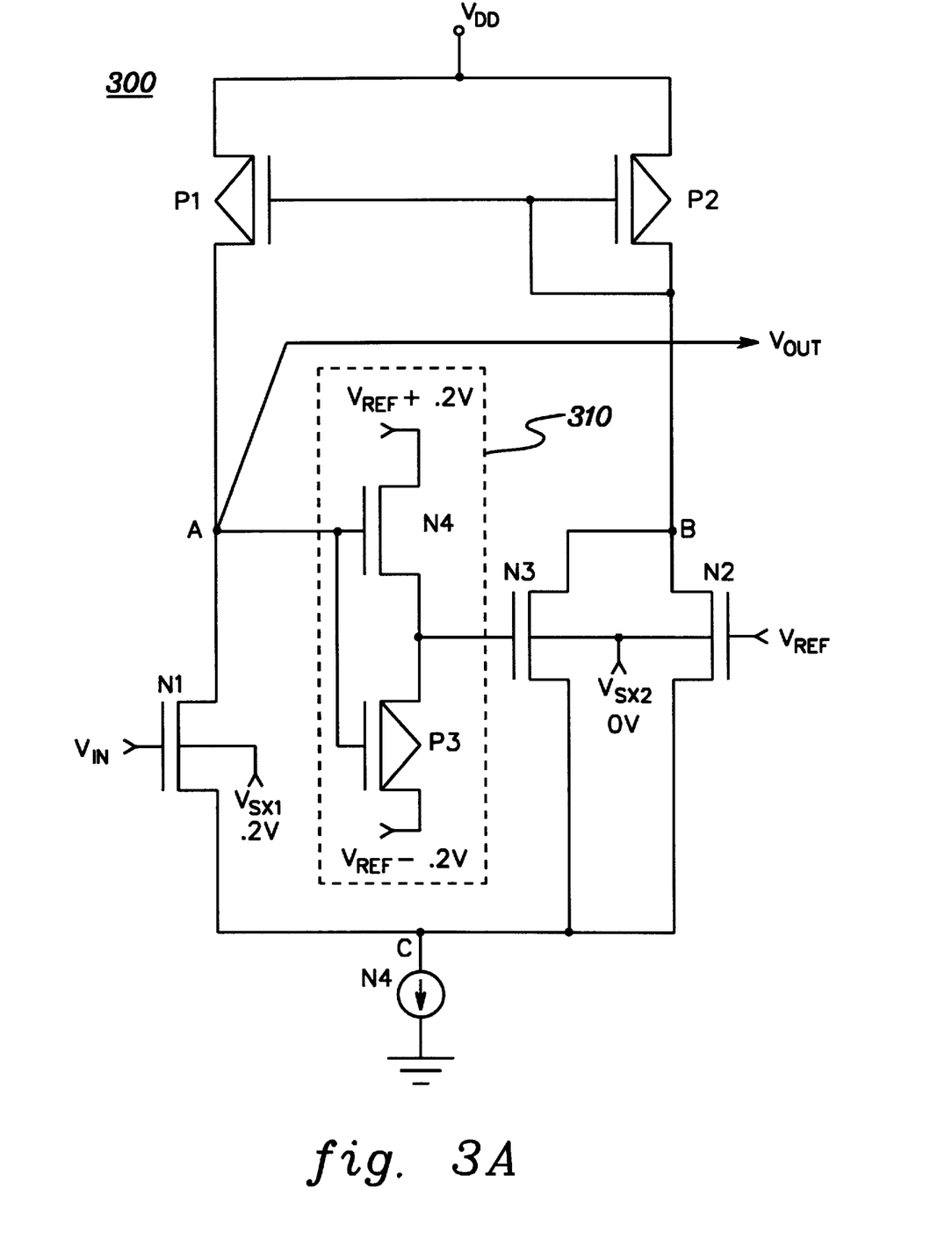
FIG. 3A depicts another embodiment of a CMOS differential receiver in accordance with the principles of the present invention showing a switching circuit for controlling the hysteresis characteristic about the reference voltage (Vref)

FIG. 3A depicts a further embodiment of the present invention wherein a CMOS differential receiver, generally denoted 300, includes a switching circuit 310 added to reduce sensitivity to power supply and process tolerance variations. In this embodiment, an NMOS transistor element N4 functions as a switch (having a low threshold voltage as shown) with its drain and source connected to a voltage signal Vref+0.2 volts, and the gate of feedback device N3, respectively. The second element P3 is a PMOS switch, preferably a depletion mode PMOS transistor, with its source connected to a gate of transistor N3 and drain connected to a second additional voltage, Vref−0.2 volts. These additional voltages, i.e., Vref+0.2 volts and Vref−0.2 volts are provided by way of example only. The first voltage, Vref+0.2 volts, sets the gate voltage of hysteresis transistor N3 on a low signal input via transistor N4, which is "on". This voltage thus becomes the receiver "trip point" as the signal input rises, thus determining the hysteresis differential of the receiver. Although a ±0.2 volts from reference Vref is shown as an example, other voltages may be chosen by the designer to set the desired hysteresis. For example, the Vref offset for switching circuit 310 may comprise the same backgate offset voltage, or a different offset. In addition, transistor N4 could be tied to Vref plus a first offset, while transistor P3 is tied to Vref minus a second offset, wherein the first and second offsets are different.

The second additional voltage, Vref−0.2 volts, sets the "off drive" to hysteresis transistor N3. This is not a critical voltage and only has to be sufficiently below Vref to turn transistor N3 off. On an input signal transition from high to low, the receiver output switches near Vref. The hysteresis offset between Vref and Vref+0.2 volts is now conveniently centered about Vref by applying a substrate voltage Vsx1 with respect to Vsx2. For example, Vsx1 equals 0.2 volts, and Vsx2 equals 0 volts. Again, however, these backgate potentials are provided by way of example only.

Figure 3B:
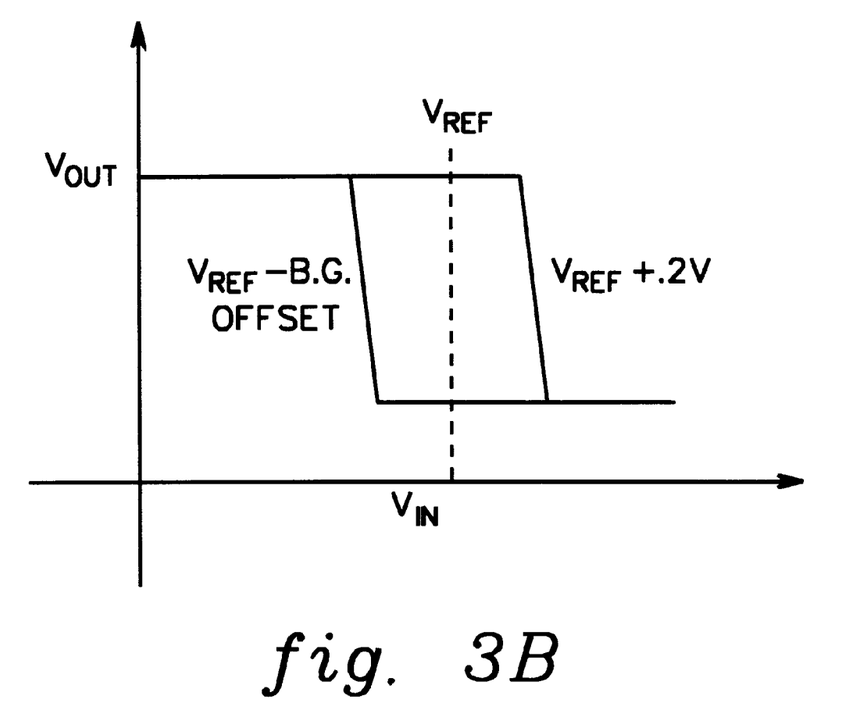
FIG. 3B is a static response curve showing a centered hysteresis characteristic employing the CMOS differential receiver of FIG. 3A.
Figure 4A:
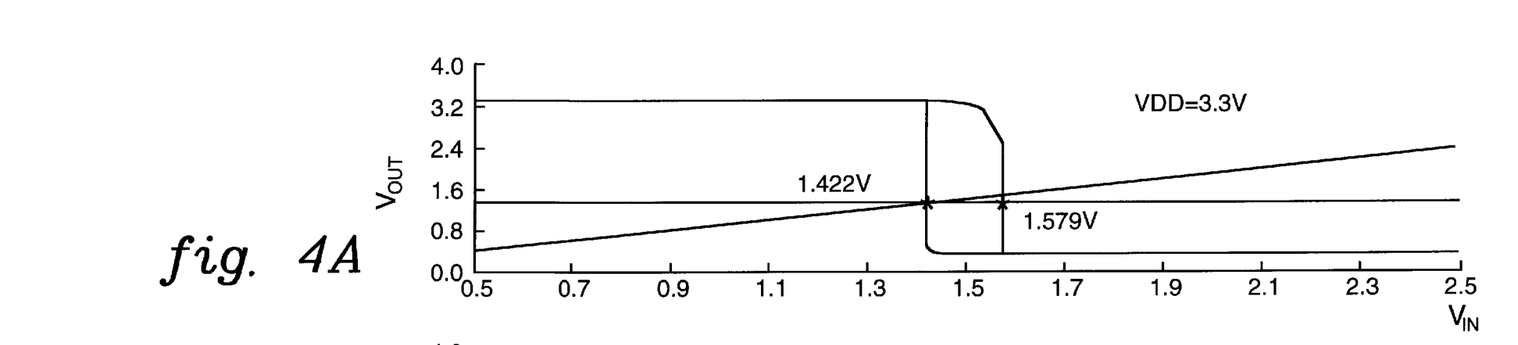
FIGS. 4A, 4B & 4C depict as examples static response curve simulations of the hysteresis characteristic of the differential receiver of FIG. 3A where power supply voltage (VDD) is varied from 3.3 volts, to 3.8 volts, to 2.8 volts, respectively.
Figure 4B:
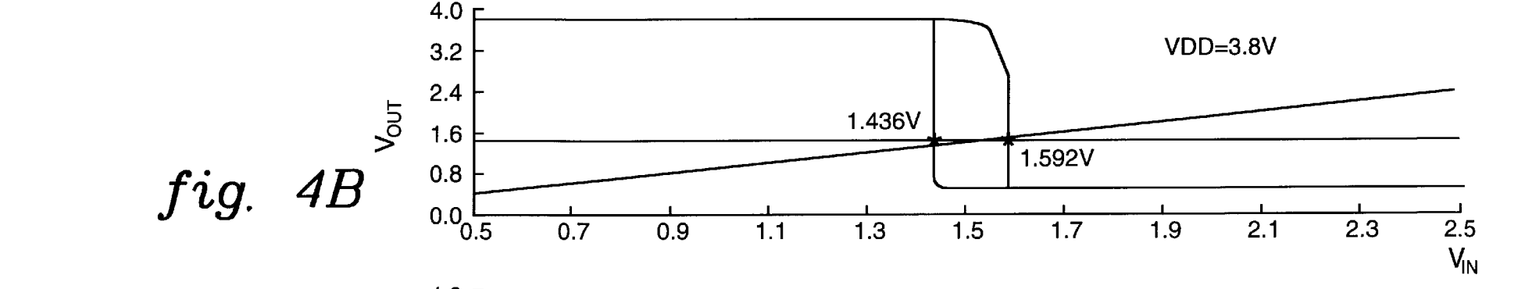
Figure 4C:
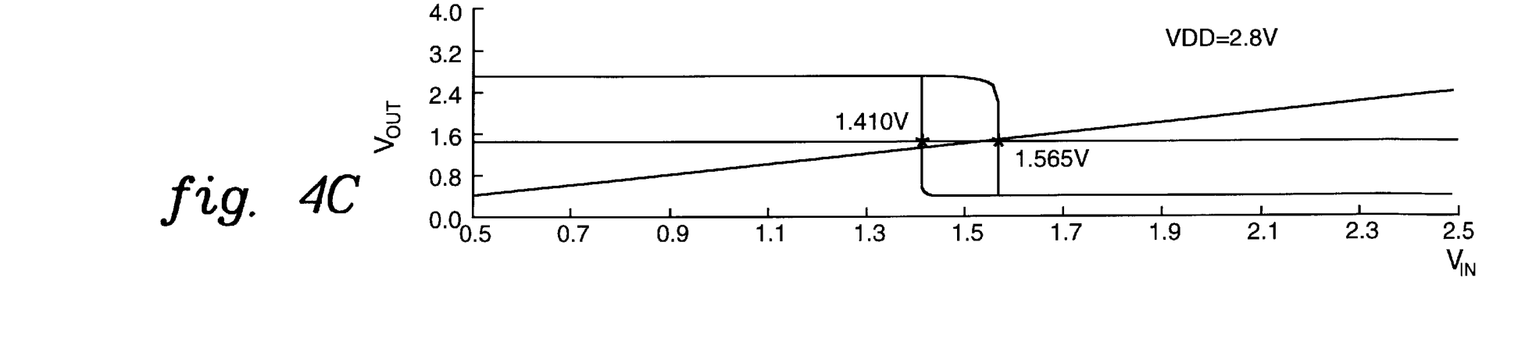
Figure 4D:
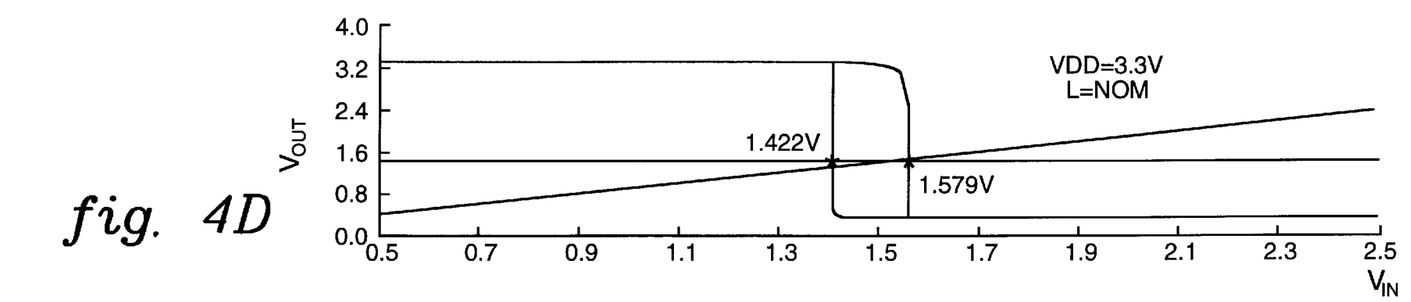
FIGS. 4D, 4E & 4F depict as examples static response curve simulations of the hysteresis characteristic of the differential receiver of FIG. 3A where power supply voltage is held constant at 3.3 volts, and transistor channel length is varied from a nominal length, to nominal length plus 70 nm, to nominal length minus 70 nm, respectively.
Figure 4E:
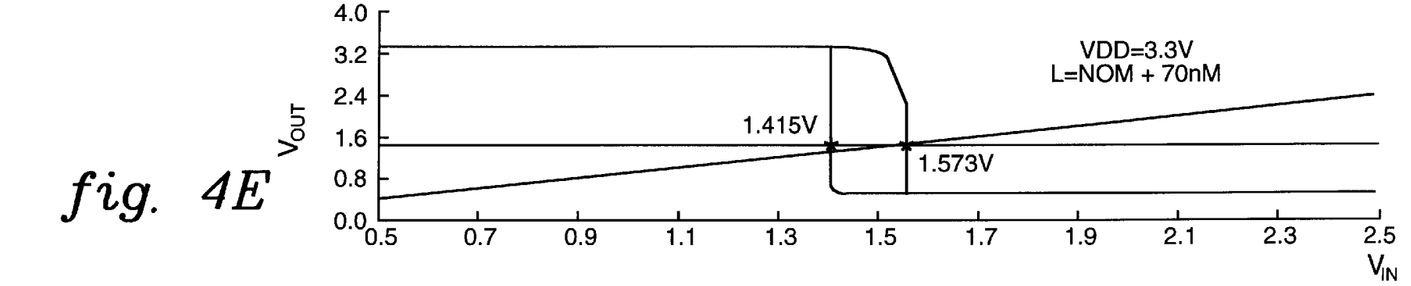
Figure 4F:
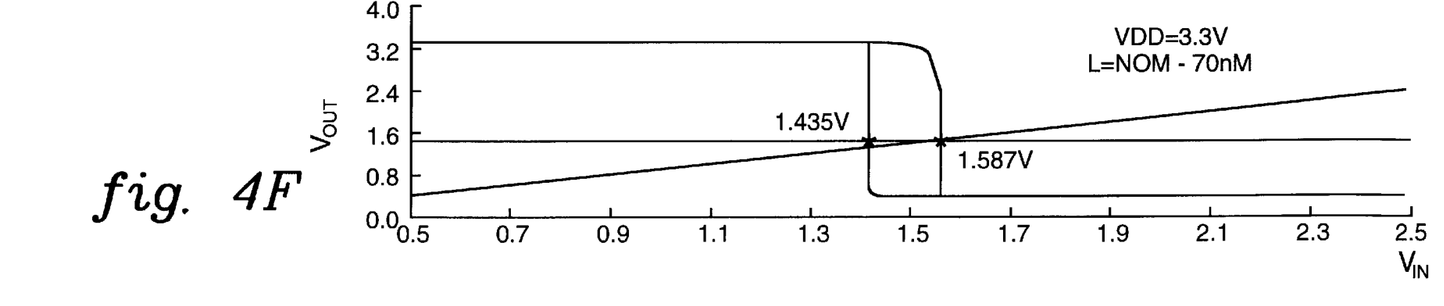

FIG. 3B depicts the centered hysteresis characteristic about Vref. Insensitivity of the resultant circuit to changes in supply voltage VDD is depicted in FIGS. 4A, 4B, & 4C where the supply voltage is shown in simulation to vary between a VDD of 3.3 volts (FIG. 4A), 3.8 volts (FIG. 4B), and 2.8 volts (FIG. 4C). In each case, the hysteresis characteristic remains centered about a Vref of 1.5. Insensitivity of the circuit to channel length variation is apparent from the simulation examples of FIGS. 4D, 4E & 4F, wherein the power supply voltage is held constant at 3.3 volts, and the channel length is varied from a nominal length (FIG. 4D), to the nominal length plus 70 nm (FIG. 4E), and the nominal length minus 70 nm (FIG. 4F). As shown by the simulations, the CMOS differential receiver of FIG. 3A is essentially insensitive to voltage variations and process tolerances.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A metal oxide semiconductor (MOS) differential receiver comprising:
    a hysteresis circuit for endowing said MOS differential receiver with a hysteresis characteristic; and
    means for adjusting said hysteresis characteristic about a reference voltage of said MOS differential receiver, said means for adjusting comprising means for establishing a dc backgate voltage differential between an input transistor and a reference transistor of said MOS differential receiver, said reference transistor receiving as input said reference voltage.

2. The MOS differential receiver of claim 1, wherein said hysteresis circuit comprises a hysteresis transistor, and wherein said means for adjusting comprises means for establishing a common backgate voltage between said hysteresis transistor and said reference transistor and means for establishing said backgate voltage differential between said input transistor and said common backgate voltage of said hysteresis transistor and said reference transistor.

3. The MOS differential receiver of claim 1, wherein said input transistor and said reference transistor each comprise an n-type MOS transistor, and wherein said means for adjusting comprises means for applying a greater backgate voltage bias to said input transistor than to said reference transistor.

4. The MOS differential receiver of claim 1, wherein said means for adjusting comprises means for centering said hysteresis characteristic about said reference voltage of said MOS differential receiver by establishing said backgate voltage differential between said input transistor and said reference transistor.

5. The MOS differential receiver of claim 1, wherein said hysteresis circuit comprises a hysteresis transistor, and wherein said MOS differential receiver further comprises a switch circuit for switching said hysteresis transistor, said switch circuit gating said hysteresis transistor at said reference voltage plus a defined offset voltage.

6. The MOS differential receiver of claim 5, wherein said switch circuit comprises two series connected transistors, said two series connected transistors being commonly gated by an output signal from said input transistor.

7. A metal oxide semiconductor (MOS) differential receiver comprising:
   a first transistor coupled for receiving a first signal;
   a second transistor coupled for receiving a second signal;
   a bias circuit having a supply voltage coupled to the first transistor and the second transistor, and having a current source also coupled to the first transistor and the second transistor;
   a hysteresis circuit coupled in parallel with the second transistor between the supply voltage and the current source;
   wherein said first signal comprises an input signal, said second signal comprises a reference signal, and an output signal is provided from an output of said first transistor; and
   wherein a bias voltage is applied as a dc backgate potential to at least one of the first transistor and the second transistor to establish a dc backgate voltage differential between the first transistor and the second transistor to thereby adjust about said reference signal a hysteresis characteristic produced by said hysteresis circuit.

8. The MOS differential receiver of claim 7, wherein said backgate potential is applied such that said hysteresis characteristic is symmetrical about said reference signal.

9. The MOS differential receiver of claim 7, wherein said bias voltage establishes a backgate voltage differential between said first transistor and said second transistor.

10. The MOS differential receiver of claim 9, wherein said hysteresis circuit comprises a hysteresis transistor, and wherein said second transistor and said hysteresis transistor have a common backgate potential.

11. The MOS differential receiver of claim 10, wherein said bias circuit further comprises a third transistor and a fourth transistor, said third transistor and said fourth transistor being connected as a current mirror, wherein said first transistor is coupled to said supply voltage across said third transistor and said second transistor is coupled to said supply voltage across said fourth transistor, and wherein said hysteresis transistor is coupled in parallel wherein said hysteresis transistor is coupled in parallel with said second transistor between the fourth transistor and the current source.

12. The MOS differential receiver of claim 11, wherein said MOS differential receiver comprises a complementary metal oxide semiconductor (CMOS) differential receiver, and wherein said first transistor, said second transistor and said hysteresis transistor each comprise an n-type MOS (NMOS) transistor, and wherein said third and fourth transistors connected as said current mirror each comprise a p-type MOS (PMOS) transistor.

13. The MOS differential receiver of claim 12, wherein a source of said first transistor, a source of said second transistor, and a source of said hysteresis transistor are each tied to said current source, a drain of said first transistor is connected to a gate of said hysteresis transistor, a drain of said hysteresis transistor and a drain of said second transistor are tied together, and wherein a drain of said first transistor is connected to a drain of said third transistor, a drain of said second transistor is connected to a drain of said fourth transistor, and wherein said fourth transistor is tied in diode configuration.

14. A metal oxide semiconductor (MOS) differential receiver comprising:
   a first transistor coupled for receiving a first signal;
   a second transistor coupled for receiving a second signal;
   a bias circuit having a supply voltage coupled to the first transistor and the second transistor, and having a current source also coupled to the first transistor and the second transistor;
   a hysteresis circuit coupled in parallel with the second transistor between the supply voltage and the current source;
   wherein said first signal comprises an input signal, said second signal comprises a reference signal, and an output signal is provided from an output of said first transistor;
   wherein a bias voltage is applied as a dc backgate potential to at least one of the first transistor and the second transistor to thereby adjust about said reference signal a hysteresis characteristic produced by said hysteresis circuit; and
   wherein said hysteresis circuit comprises a hysteresis transistor and a series connected first switch transistor and second switch transistor, said series connected first switch transistor and second switch transistor being coupled between said reference signal plus a first offset voltage and said reference signal minus a second offset voltage, said series connected first switch transistor and second switch transistor being gated by a signal at an output of said first transistor, an output of said first switch transistor and an output of said second switch transistor being coupled to a gate of said hysteresis transistor.

15. The MOS differential receiver of claim 14, wherein said first switch transistor comprises an n-type MOS transistor and said second switch transistor comprises a p-type MOS transistor, and wherein a drain of said fifth transistor is connected to said reference signal plus said first offset voltage, and a drain of said sixth transistor is connected to said reference signal minus said second offset voltage.

16. The MOS differential receiver of claim 14, wherein said first switch transistor comprises a depletion mode n-type MOS transistor, and wherein said second switch transistor comprises a depletion mode p-type MOS transistor.

17. The MOS differential receiver of claim 14, wherein said first offset voltage is equal to said second offset voltage.

18. An integrated circuit comprising a metal oxide semiconductor (MOS) differential receiver, said MOS differential receiver including:

a first transistor coupled for receiving a first signal;

a second transistor coupled for receiving a second signal;

a bias circuit having a supply voltage coupled to the first transistor across a third transistor and coupled to the second transistor across a fourth transistor, the third and fourth transistors being connected as a current mirror, and having a current source also coupled to the first transistor and the second transistor;

a hysteresis circuit coupled in parallel with the second transistor between the fourth transistor and the current source;

wherein said first signal comprises an input signal, said second signal comprises a reference signal, and an output signal is provided from an output of said first transistor; and wherein a dc bias voltage is applied as a backgate potential to at least one of the first transistor and the second transistor to establish a dc backgate voltage differential between the first transistor and the second transistor to thereby adjust about said reference signal a hysteresis characteristic produced by said hysteresis circuit.

19. A metal oxide semiconductor (MOS) differential receiver comprising:

a first transistor coupled for receiving a first signal;

a second transistor coupled for receiving a second signal;

a bias circuit having a supply voltage coupled to the first transistor and the second transistor, and having a current source also coupled to the first transistor and the second transistor;

a hysteresis transistor coupled in parallel with the second transistor;

a switching circuit for gating said hysteresis transistor, said switching circuit being coupled between a reference signal plus a first offset voltage and said reference signal minus a second offset voltage for applying one of said reference signal plus said first offset voltage or said reference signal minus said second offset voltage to the gate of said hysteresis transistor, said switching circuit being controlled by a signal at an output of said first transistor; and wherein said first signal comprises an input signal, said second signal comprises said reference signal, and said signal at said output of said first transistor comprises an output signal.

20. The MOS differential receiver of claim 19, wherein said switching circuit comprises a series connected third transistor and fourth transistor, said series connected third transistor and fourth transistor being coupled between said reference signal plus said first offset voltage and said reference signal minus said second offset voltage, said series connected third transistor and fourth transistor being commonly gated by said signal at said output of said first transistor, and an output of said third transistor and an output of said fourth transistor being coupled to a gate of said hysteresis transistor.

21. The MOS differential receiver of claim 20, wherein said third transistor comprises an n-type MOS transistor and said fourth transistor comprises a p-type MOS transistor, and wherein a drain of said third transistor is connected to said reference signal plus said first offset voltage, and a drain of said fourth transistor is connected to said reference signal minus said second offset voltage.

22. The MOS differential receiver of claim 20, wherein said third transistor comprises a depletion mode n-type MOS transistor, and wherein said fourth transistor comprises a depletion mode p-type MOS transistor.

23. In a semiconductor circuit coupled to an external supply voltage and having at least one differential receiver circuit therein, said differential receiver circuit receiving a logic signal input having first and second states, a method of adjusting a predetermined switching point of said differential receiver circuit, said differential receiver circuit having an input transistor and a reference transistor, each coupled to a bias circuit, said method comprising the steps of:

(a) deriving a reference voltage for application to said reference circuit, said reference voltage having a voltage magnitude substantially equal to a voltage magnitude of the predetermined switching point;

(b) receiving the logic input signal at said input circuit;

(c) translating said logic input signal in said differential receiver circuit to an output having an output in a first state when the logic input signal is in a first state, and translating the output to a second state when the logic input signal is in a second state; and (d) modifying the switching point to a lower voltage level when the output changes to the first state and modifying the predetermined switching point to a higher voltage level when the output changes to the second state, wherein said modifying comprises disposing said lower level and said higher level about said predetermined switching point by establishing a dc backgate voltage differential between said reference transistor and said input transistor.

* * * * *

UNITED STATES PATENT AND TRADEMARK OFFICE
CERTIFICATE OF CORRECTION

PATENT NO. : 6,281,731 B1
DATED : August 28, 2001
INVENTOR(S) : Fifield et al.

It is certified that error appears in the above-identified patent and that said Letters Patent is hereby corrected as shown below:

Column 8,
Line 59, delete "sixth" and insert -- second --

Signed and Sealed this

Twenty-fifth Day of June, 2002

Attest:

JAMES E. ROGAN
Attesting Officer   Director of the United States Patent and Trademark Office

UNITED STATES PATENT AND TRADEMARK OFFICE
CERTIFICATE OF CORRECTION

PATENT NO.    : 6,281,731 B1
DATED         : August 28, 2001
INVENTOR(S)   : Fifield et al.

Page 1 of 1

It is certified that error appears in the above-identified patent and that said Letters Patent is hereby corrected as shown below:

<u>Column 8,</u>
Line 57, delete "fifth" and insert -- first switch -- before the word "transistor"

Signed and Sealed this

Twenty-second Day of October, 2002

Attest:

Attesting Officer

JAMES E. ROGAN
*Director of the United States Patent and Trademark Office*